United States Patent [19]
Temple

[11] Patent Number: 6,110,763
[45] Date of Patent: Aug. 29, 2000

[54] ONE MASK, POWER SEMICONDUCTOR DEVICE FABRICATION PROCESS

[75] Inventor: Victor Albert Keith Temple, Clifton Park, N.Y.

[73] Assignee: Intersil Corporation, Palm Bay, Fla.

[21] Appl. No.: 08/861,562

[22] Filed: May 22, 1997

[51] Int. Cl.[7] .................................................. H01L 21/332
[52] U.S. Cl. .......................... 438/133; 438/135; 438/138
[58] Field of Search ..................................... 438/133, 135, 438/136, 137, 138, 206; 257/107, 110, 133, 135

[56] References Cited

U.S. PATENT DOCUMENTS

| | | | |
|---|---|---|---|
| 5,194,394 | 3/1993 | Terashima | 438/138 |
| 5,286,981 | 2/1994 | Lilja et al. | 438/135 |
| 5,766,966 | 6/1998 | Ng | 148/DIG. 126 |
| 5,843,796 | 12/1998 | Disney | 438/133 |

*Primary Examiner*—Tuan H. Nguyen
*Attorney, Agent, or Firm*—Rogers & Killeen

[57] ABSTRACT

A method of fabricating a MOS controlled thyristor (MCT) semiconductor power device which reduces process time, reduces cell size, and increases the density of turn-off channels. The method uses a single, dopant-opaque mask to form MCT structure above the bottom N and P layers, including the upper portions of PNP and NPN transistors which form the MCT and On-FETs and Off-FETs which operate the MCT. The single mask may also be used to fabricate floating field rings for the device. The method may also be used on both sides of the device to provide a Fast Turn Off (FTO) device with both On- and Off-FETs on one side and at least an Off-FET on the other side.

25 Claims, 7 Drawing Sheets

FIG. 1 *PRIOR ART*

ONE MASK, POWER SEMICONDUCTOR DEVICE FABRICATION PROCESS

BACKGROUND OF THE INVENTION

The present invention relates to methods of fabricating power semiconductor devices, and more particularly to a single mask method of making a cellular thyristor semiconductor power device which reduces process time, reduces cell size, and increases the density of turn-off channels.

Thyristor semiconductor power devices are well known in the art and include a variety of device types. For example, and with reference to FIG. 1, a MOS controlled thyristor (MCT) 10 may include numerous operating cells 12, each with an Off-FET for turning the device off, and fewer On-FETs with drains 14 for turning the device on, which may be surrounded by transition cells 16. Application of specific voltages to a gate 18 turns the MCT on or off by operating the Off-FETs or On-FETs. Operation and application of such devices is known to those of skill in the art.

As is typical, operating cells 12 are in an N type base 20 which is on a P type layer which has a P type base 22 and an optional buffer layer 24. The P type layer is atop an N+ layer 25 which is an emitter of an NPN wide base bipolar junction transistor comprising layer 25 which is the NPN emitter, P layers 22 and 24 which are the NPN base, and N base 20 which is the NPN collector. Each operating cell 12 includes a P type well 26 having a P+ region 28 and an N+ source region 30 therein. The P type well 26 and P+ region 28 form an emitter of a PNP bipolar junction transistor which also includes N type upper base 20 (the PNP base) and P type base 22 (the PNP collector). Source region 30 is the Off-FET source, N type base 20 is the Off-FET drain, and the gap therebetween forms the Off-FET gate controlled channel region 32. A P type well 34 in transition cell 16 is the On-FET source, a portion 14 of the P type base 22 at the substrate surface is the On-FET drain, and the gap therebetween is the On-FET gate controlled channel region 36.

Such devices work well, but can be improved in both manufacturability and in performance. Semiconductor devices are fabricated in multi-step processes in which each step is costly and time consuming. The need for each step is carefully analyzed and steps are eliminated or consolidated whenever possible. The cost and time saved by elimination of even a single step makes a process in which such an improvement is found a valuable asset.

One of the ways the number of steps can be reduced is by reducing the number of masks which are used to form the cells. As is known, one mask may be used for several sequential steps in what are denoted self-aligned processes. For example, U.S. Pat. No. 5,045,903 to Meyer, et al. and U.S. Pat. No. 5,528,058 to Pike, Jr., et al. disclose single mask processes. The latter of these patents discloses a process by which portions of cells of an MCT may be fabricated with a single mask, but in which an upper layer is formed epitaxially. This additional epitaxial growth step is desirably avoided. As will be discussed, in an embodiment of the present invention a single mask is used to form the cells and to form the upper bases and On-FET drains of the device, a feature not suggested in the prior art. The same mask may also be used to form floating field rings at the periphery of the device.

One of the areas in which the performance of such devices can be improved is in device turn-off. One of the ways that device turn-off can be improved is by increasing the density of Off-FET channels 32. As may be seen in FIG. 1, if the number of cells per unit area can be increased by making the cells smaller, the density of Off-FET channels will increase. However, the lateral arrangement of the cells and the practical problem of manufacturing tolerances have heretofore limited the sizes of cells. For example, smaller cells and more densely populated cells require more precise alignment of the process performed in each step. The present invention uses a self-aligned process which can make smaller cells, thereby improving the turn-off performance of cellular gated semiconductor power device, such as an IGBT or MCT.

Accordingly, it is an object of the present invention to provide a novel method of fabricating a thyristor semiconductor device which uses a single mask, reduced diffusion process and thereby obviates the problems of the prior art.

It is another object of the present invention to provide a novel method of fabricating a semiconductor device that is operated with On-FETs and Off-FETs and in which a single mask is used to form cells in the device and to form upper bases of three-layer bipolar transistors and drains of On-FETs in the device.

It is still another object of the present invention to provide a novel method of fabricating a MOSFET controlled, four-layer semiconductor device in which a single dopant-opaque mask is used to form all structure above the bottom two layers of the device, including the upper portions of two three-layer bipolar transistors which form the four-layer device and On-FETs and Off-FETs which operate the device.

It is yet another object of the present invention to provide a novel method of fabricating an PNPN semiconductor device whose operation is controlled with On-FETs and Off-FETs, in which a single dopant-opaque mask, which sits atop a P layer which is atop an N layer, has first openings spaced apart so that a diffusing N type dopant merges in adjacent first openings to form upper bases of PNP transistors in which the P layer is a collector, and second openings spaced apart so that the diffusing N type dopant does not merge in adjacent second openings to thereby form P drains of On-FETs, and in which N layer is an emitter of NPN transistors having the upper bases as collectors.

It is a further object of the present invention to provide a novel method of fabricating a semiconductor device that is operated with On-FETs and Off-FETs in which a single mask is used to form upper bases of three-layer bipolar transistors, drains of On-FETs, and floating field rings in the device.

It is yet a further object of the present invention to provide a novel method of fabricating a two-sided Fast Turn Off (FTO) semiconductor device that has On-FETs and Off-FETs on one side and at least an Off-FET on the other side in which each side is fabricated with a single mask.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

An embodiment of present invention is a single mask method of fabricating a four-layer (PNPN or NPNP) semiconductor power device that is operated with On-FETs and Off-FETs within the device, such as an MCT. In other words, the method includes the fabrication of the two three-layer (i.e., the PNP and NPN) transistors and the On- and Off-FETs in the device, all with a single mask. In a further embodiment, the single mask may also be used to provide floating field rings.

Figure 1:
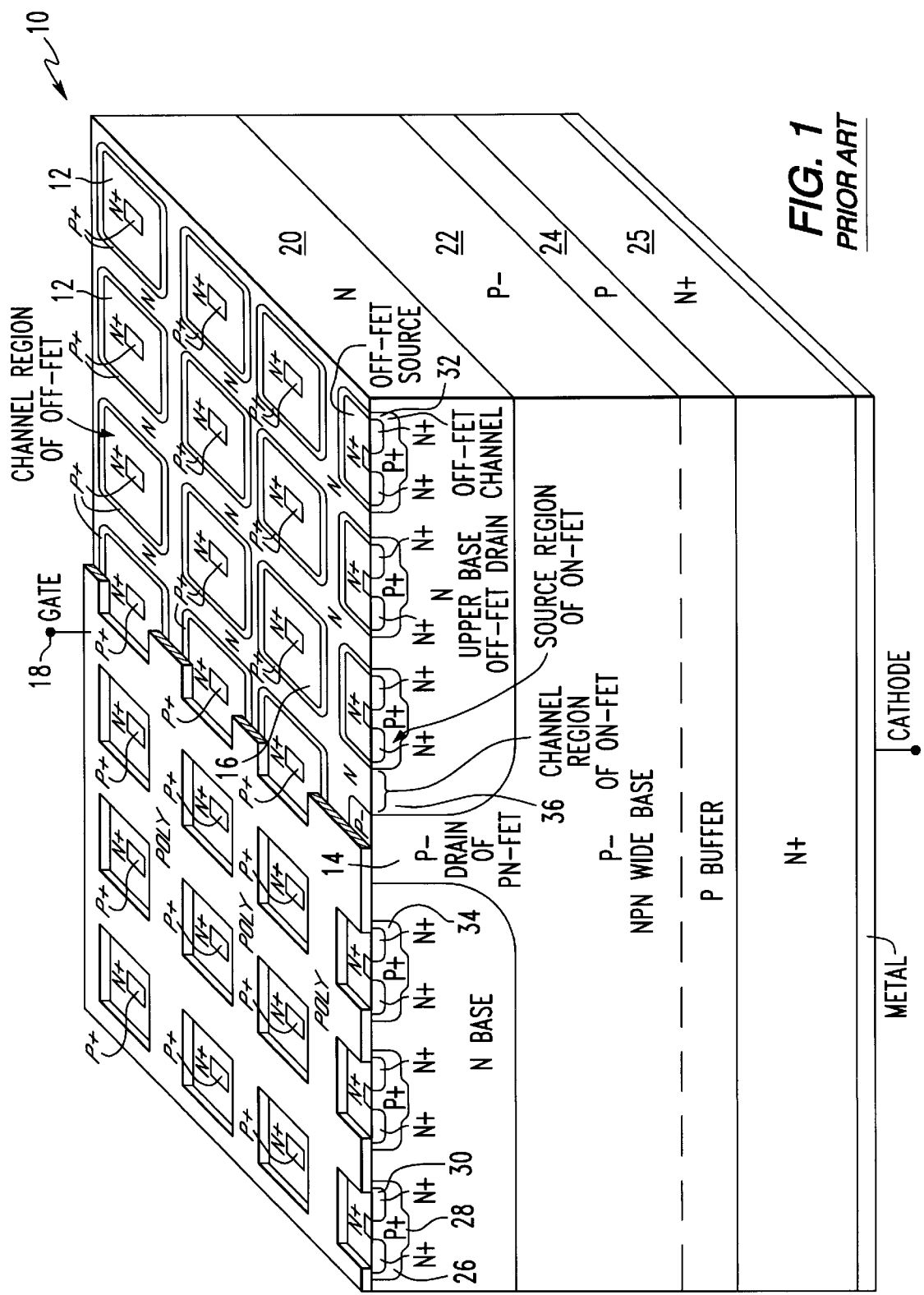
FIG. 1 is a pictorial illustration of a MOS Controlled Thyristor (MCT) of the prior art.
Figure 2:
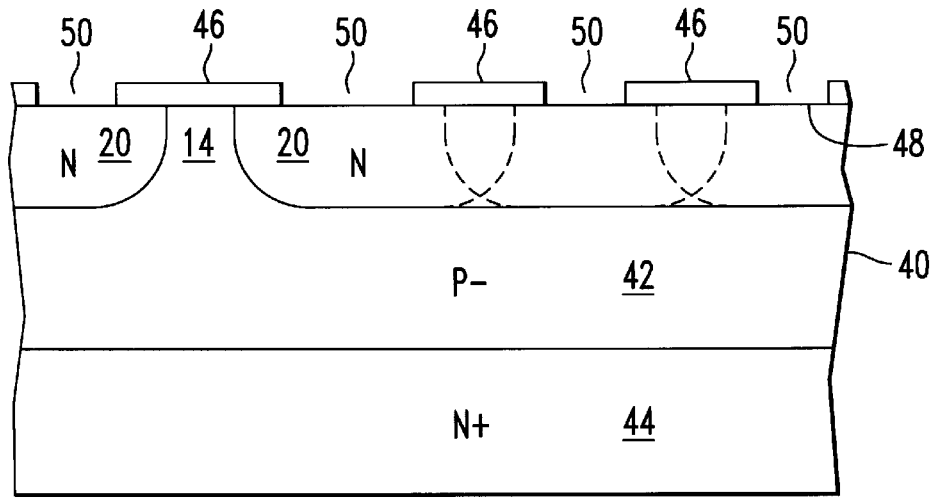
FIG. 2 is a vertical cross section illustrating formation of upper bases and On-FET drains in an embodiment of the method of the present invention.

With reference to FIG. 2, a semiconductor substrate 40 may include a P- layer 42 (corresponding to base 22 and optional buffer 24 in FIG. 1) atop an N+ layer 44 (corresponding to N+ layer 25 in FIG. 1), both of which may be provided conventionally.

A single, dopant-opaque mask 46 is provided on the upper surface 48 of substrate 40. Mask 46 includes openings for forming the various components of the semiconductor device. For highest Off-FET cell density, first openings 50 are spaced apart so that an N type dopant diffused through first openings 50 will merge in adjacent ones of first openings 50 to form the PNP transistor base (upper base 20 in FIG. 1). That is, the distance between adjacent first openings 50 is less than twice the lateral diffusion distance of the N type dopant. Second openings 52 in mask 46 are spaced apart from any adjacent openings in the mask so that the diffusing N type dopant does not merge in order to form a P drain of the On-FET 14 in FIG. 1. That is, the distance between a second opening 52 and an adjacent opening is greater than twice the lateral diffusion distance of the N type dopant. Second openings 52 need not be as dense as first openings 50 but should be uniformly distributed.

The N type dopant is thereafter implanted through the first and second openings and diffused conventionally to form the N regions shown in FIG. 2. The implant need not be high energy and is preferably vertical (90° to substrate surface) to avoid shadows, and not the typical 7–14° from vertical of the prior art. Conventional steps may be taken to avoid channeling (dopant too deep in the silicon) which may otherwise occur with a vertical implant, such as a thin thermal oxidation of the surface that may be removed at a convenient time later without appreciably affecting the other layers and regions of the device. Note that an operable device can be formed even if none of the diffusing N regions overlap, although the preferred practice is to have an overlap to increase Off-FET density and to interconnect the upper bases 20. When viewed from overhead, On-FET drains 14 may be polygons with equal length sides and angles. Circular On-FET drains 14 are preferred, but are difficult to make; squares are easiest to make but may have localized regions with breakdown voltage problems.

Figure 3:
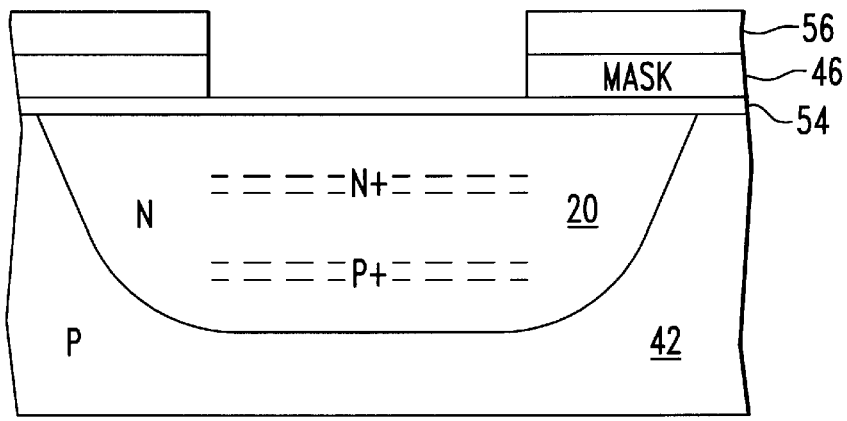
FIG. 3 is a vertical cross section illustrating the implanted dopants which will form wells and source regions in an embodiment of the method of the present invention.

With reference now to FIG. 3, mask 46, which may be a polysilicon layer heavily doped to be conductive or a high temperature silicide or metal, may be atop a gate oxide 54, such as $SiO_2$. An optional nitride (or oxide and nitride) layer 56 may also be provided. Layer 56 can be selectively wet etched later, if appropriate, and its thickness may be chosen to help stop a subsequent deep well implant from penetrating too deeply and to help prevent a subsequent shallow trench etch from removing the underlying polysilicon.

Figure 4:
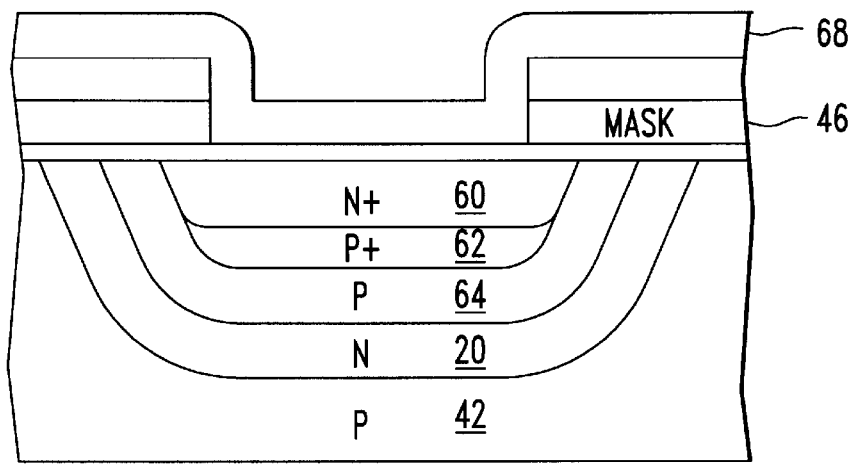
FIG. 4 is a vertical cross section illustrating the single diffusion which forms the wells and source regions in the embodiment of FIG. 3.

Thereafter, an N type dopant, such as arsenic, is implanted through the openings to a shallow level at high concentration, and then a P type dopant, such as boron, is implanted through the openings with an intermediate doping concentration at a higher energy level than the N type dopant. While other dopants may be used, the P type dopant should have a faster diffusion rate than the N type dopant and a propensity to migrate into high concentrations of the N type dopant. The order of implanting the N and P type dopants may be reversed with modest differences that may be predicted with commercially available modeling packages. These implants are illustrated in FIG. 3 by the horizontal dashed lines. The N+ source and P type well implants are preferably vertical implants, and while the N type upper base implant illustrated in FIG. 2 may also be vertical, its angle is less important because it is driven comparatively deeply so that any shadowing has relatively little impact. As shown in FIG. 4, a subsequent diffusion activates the implanted dopant in the upper base to form N+ region 60, underlying P+ emitter region 62 and P well 64 (corresponding to P type well 26 in FIG. 1). In any of the device structures described, the order of the well and source implant and the number of drive steps is tailored to the species chosen as known in the art. Further, if high energy implants are not used, then it is still within the scope of the one-mask process described herein to use a separate implant and drive for each of the layers upper base 20, well 64, emitter 62, and source 60.

The implant and diffusion of the N type dopant described above may be eliminated if the N concentration in well 20 is sufficient for the particular device. That is, the N concentration in well 20 may be high enough so that a separate N type implant is not needed to increase the concentration. Nevertheless, the N type implant is desirable to afford greater freedom in the selection of the dopant concentration for the well.

Further, while the source and well process described above may be accomplished with a single drive, the spirit of the present invention is not contravened by the more standard method of separate source and well drives as would be required, for example, if the well and source diffusion coefficients were not so well suited as the arsenic source and boron well in the example above.

Figure 5:
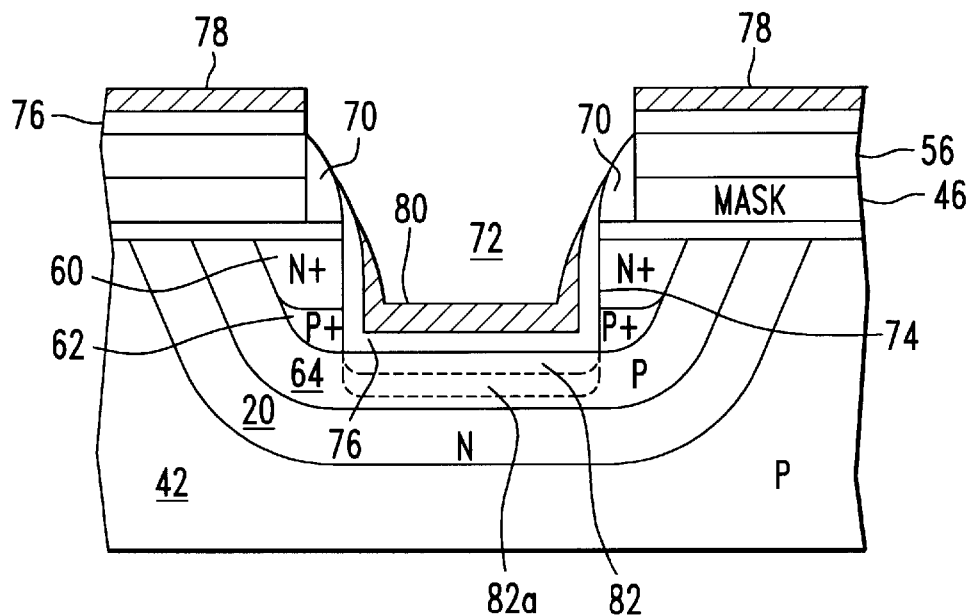
FIG. 5 is a vertical cross section illustrating the shallow trench, sidewall spacers and metalization in the embodiment of FIG. 4.

With further reference to FIG. 4, a conformal insulator 68, such as a low temperature oxide (LTO), may be applied over the device in preparation for the conventional formation of sidewall spacers 70, such as illustrated in FIG. 5. To arrive at the device depicted in FIG. 5 a shallow trench etch which forms fairly vertical side walls (preferably not undercutting the sidewall spacer) may be used to form shallow trench 72 between the spacers 70. A shallow trench is one which has a depth approximately equal to the depth of the source (the shallowest layer in the silicon), and is discussed in U.S. Pat. No. 4,809,047 issued Feb. 28, 1989 to Temple which is incorporated by reference (see, e.g., FIG. 6 therein). It is only necessary for the shallow trench etch to be deep enough to make effective contact to the well and emitter. Thus the shallow trench etch preferably extends shallow trench 72 down through the source 60 and P+ region 62 to expose an upper surface of P well 64. The preferred shallow trench etch is targeted for 4000 to 6000 Å. The shallow trench etch has a wide window as the shallow trench may almost reach through the well. This window may be increased at both ends by a later optional surface/emitter enhancement implant. Shallow trench 72 may be patterned by the layer 56 and spacers 70, or may be a self-aligned V-groove formed by a K—OH etch into the appropriate silicon surface (not shown, described in U.S. Pat. No. 4,516,143 issued May 7, 1985 to Love which is incorporated by reference, see, e.g., FIG. 10 therein).

The shallow trench etch exposes an upper surface of P well 64 and vertical surfaces 74 of N+ region 60 and underlying P+ region 62. A conduction enhancing layer 76, such as a self-aligned silicide layer, may then be formed conventionally on exposed silicon (titanium being the preferred sputtering metal to form the silicide $TiSi_2$, although other metals may be used) to enhance ohmic contact to the source/well region and the gate polysilicon region. An etch may be used to remove the sputtered metal from non-silicon areas leaving the self-aligned silicide layer atop the silicon.

Figure 6:
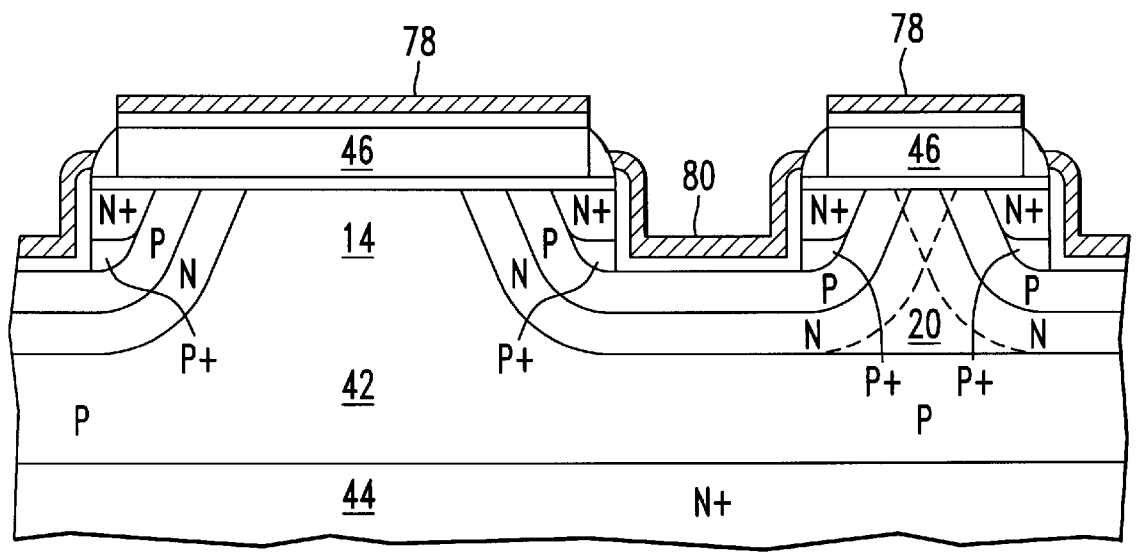
FIG. 6 is a vertical cross section illustrating the upper portion of the device formed by the steps shown in FIGS. 2–5.

A conductive metal film may then be applied electrolessly to form a gate conductor 78 atop mask 46 and a source contact 80 in shallow trench 72 which are separated by sidewalls 70. Source contact 80 contacts through the silicide vertical surfaces 74 of N+ region 60 and underlying P+ region 62. A conductive metal (not shown) may also be applied to the other surface of substrate 40 to form a backside conductive surface. FIG. 6 illustrates the device upon completion of these steps (layer 56 removed) and shows the interconnected upper base 20 and On-FET drain 14 formed by the predetermined separation of the openings in mask 46.

After the shallow trench etch and before formation of the silicide a further P type dopant optionally may be implanted into the exposed upper surface of P well 64 to improve ohmic contact with the emitter and/or to improve emitter efficiency. This emitter contact enhancement implant (shown as dashed regions 82 and 82a in FIG. 5) may be provided without a further mask and need not be driven at this point as the implant will be activated by later steps. The implant step may include two implants at the same time to increase dopant concentration deeper into the well. For example, 1E15 boron may be implanted at 100 Kev (which will be implanted about 2000 Å, e.g., region 82a) chiefly aimed to improve emitter efficiency, and 1E15 $BF_2$ may be implanted at 50Kev to a shallower depth (e.g., region 82) chiefly aimed to improve ohmic contact at the surface. These implants are also preferred to be vertical and their energy may be chosen somewhat higher than the above example depending on the amount of surface silicon that would be consumed by the subsequent self-aligned silicidation step. The emitter contact enhancement implant also allows greater flexibility in the depth tolerances for the shallow trench etch. For example, if a 5000 Å deep trench is desired, but a deeper trench (e.g., 10,000 Å) is made, the further implant would make up for the loss of emitter efficiency caused by the deeper trench. If the trench were 500 Åshallower than the source, the enhancement implant(s) would convert the surface to P type and enable the emitter contact to be formed. The emitter contact enhancement implant finds application in a variety of devices, including MOSFETs, IGBTs, MCTs and the like, although the higher energy portion of the implant (e.g., the 100 Kev portion in the example above) would not be needed unless the region needed to function as an emitter as in the MCT. Further, the enhancement implants may be omitted altogether with a heavy enough well implant and a carefully etched shallow trench.

The steps described with reference to FIGS. 3–5 may be carried out conventionally, and may be varied without departing from the present invention. For example, a high temperature refractory material may replace polysilicon in mask 46, or each implant could be driven with a separate diffusion. By way of further example, use of layer 56 may be avoided by providing mask 46 with polysilicon thick enough to allow it to be partially destroyed in the subsequent steps. This may be considered less desirable because it allows the sidewall spacers to extend up above the polysilicon which may cause mechanical problems later. Layer 56 may also be a high temperature silicide which could withstand the diffusion drives. A further alternative may be a combination oxide/nitride layer 56 where the nitride prevents the underlying oxide from being etched at the sidewall spacer etch step and the oxide is chosen to be thin enough to be nearly totally removed by the shallow trench etch.

Contact between source contact 80 and the source region 64 may be enhanced by not etching a portion of shallow trench 72 which is generally orthogonal to the longitudinal axis of shallow trench 72 so as to form a grid of parallel lines (like rungs of a ladder), such as described in the above-referenced U.S. Pat. No. 4,809,047 (see, e.g., FIG. 9 therein). While an extra mask would be required, source contact would be further assured. Further, the extra mask step could simply be photoresist and its alignment, being orthogonal stripes, is a trivial matter.

While the process has been described in relation to particular conductivity types, the process is applicable for devices of the opposite conductivity types as well. For example, the process may be used to provide N-channel or P-channel Off-FETs, although the P-channel Off-FETs would benefit from extra drive time for the N well. As will be appreciated by those of skill in the art, MOS channel regions can be made in the depletion mode where, at zero gate bias, the channel conducts. In the process herein this type of channel is formed not by counterdoping the surface with an N type shallow implant late in the process as is typical, but by not quite fully diffusing the high energy P type well implant all the way up the substrate surface. This technique saves an implant and is accomplished by adjusting the drive time.

The cells formed by the present invention may take any appropriate shape when viewed from atop the device, although striped cells are preferred because gate and source metalization is simplified. For example, and with reference to FIG. 7, gate metalization stripes 84 may be interleaved with source metalization stripes 86. Bonding areas may be provided as shown.

Figure 7:
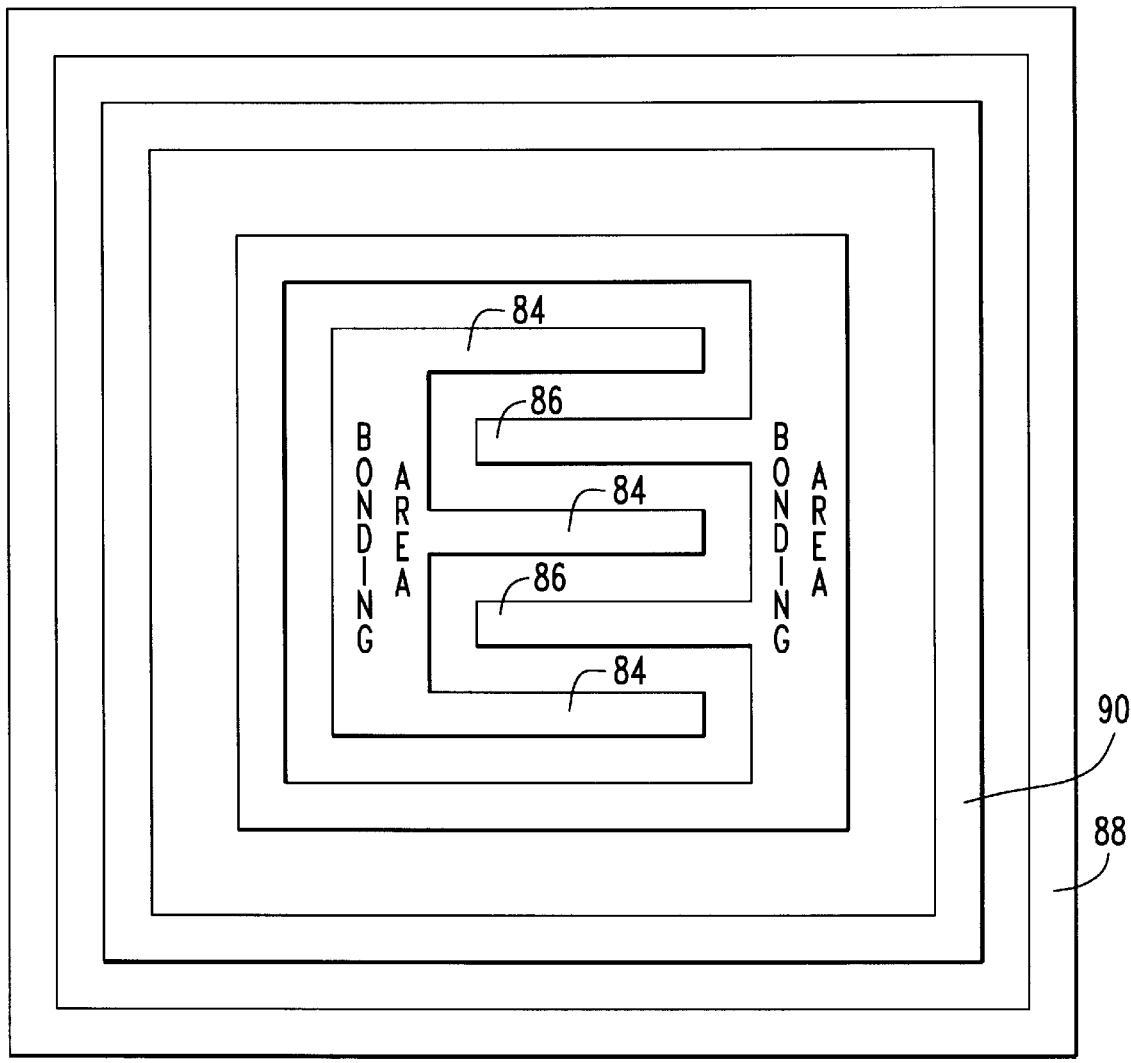
FIG. 7 is an overhead view of gate and source metalization and peripheral field rings and plates in a further embodiment of the present invention.

With further reference to FIG. 7, and in an aspect of the present invention which will find application in a variety of semiconductor devices—not only thyristor devices operated with On-and Off-FETs, one or more floating field rings 88 and/or one or more floating field plates 90 may also be provided by providing further openings in mask 46. Field rings 88 may take the form of a peripheral stripe of source metalization (i.e., source metal 80 in FIG. 5) formed by the steps outlined above and which are allowed to float electrically. Field rings 88 are capacitive interacting floating field rings. The capacitive interconnection between rings 88 is formed by the floating upper surface active region and the gate oxide. Field plates 90 may be a peripheral stripe of gate metalization (i.e., gate metal 78 in FIG. 5) formed by the steps outlined above. The metalization in the rings and plates may be increased with electroless nickel and gold, for example, which can be wire bonded or soldered. The build up of metalization may be limited by the polysilicon gate thickness which sets the height of the sidewall spacer that insulates the gate from the source.

If any ring-to-plate voltage exceeds the gate oxide breakdown voltage, even momentarily, the ring and plate will be shorted at the inner of the rings that the gate is above (i.e., between mask 46 and N+ region 60 on the interior side of the ring) because this is the point of highest field. After the short is formed, the gate will tend to decrease surface fields for that ring. Sufficient rings and plates may be provided as needed to withstand high voltages at a very high percentage of the ideal breakdown voltage. For example, 50 floating field rings and floating field plates can be provided for high voltage power transmission applications.

Figure 8:
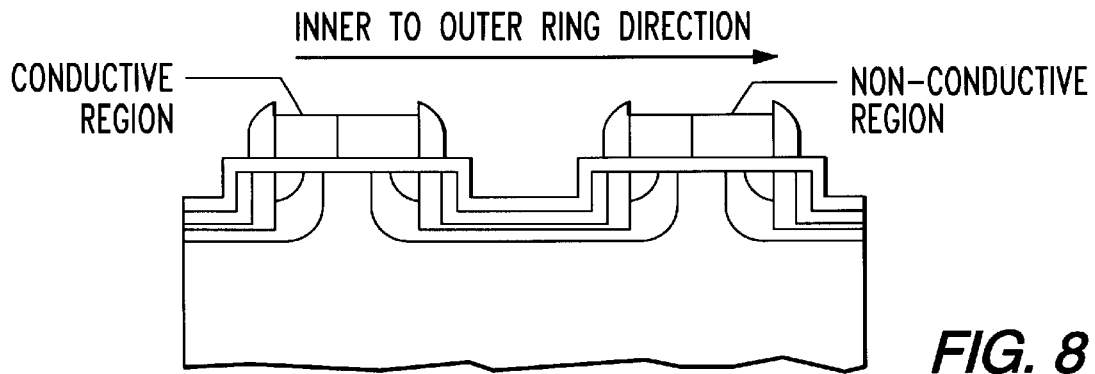
FIG. 8 is a vertical cross section illustrating the upper portion of an edge region with a partial field plate in a further embodiment of the present invention.
Figure 9:
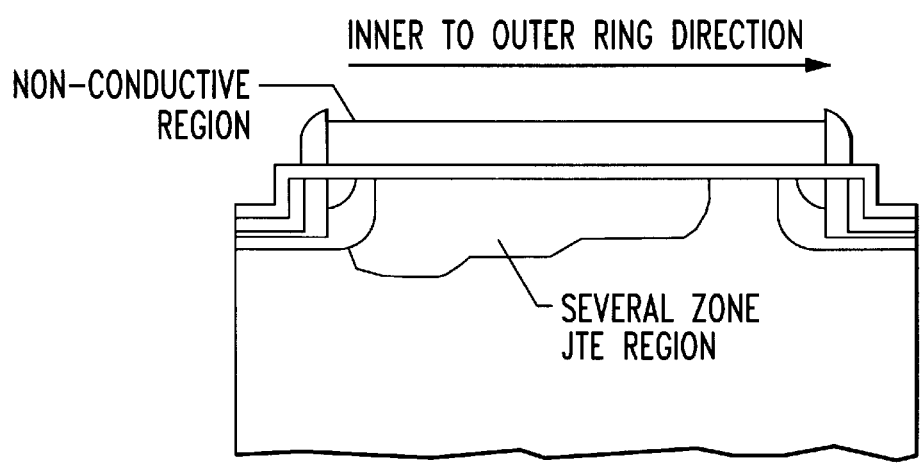
FIG. 9 is a vertical cross section illustrating the upper portion of an edge region with a JTE region in a further embodiment of the present invention.

In alternative embodiments, further masks may be used in the device to form a conventional floating field ring or junction termination extension (JTE) at the device periphery. For example, if the gate polysilicon in mask 46 in the edge region is not doped (one further mask) and the edge region is protected by photo-resist (a second additional mask) at titanium sputtering during silicidation, floating field rings will be formed in the conventional manner. By using a further mask, some of the gate polysilicon can be doped to form a field plate at the outer edge of the field rings, such as illustrated by the outer non-conductive region in FIG. 8. As illustrated in FIG. 9, a traditional JTE may be provided conventionally under undoped gate polysilicon that has been protected from metalization. In this embodiment it is not necessary to use a photoresist method to prevent the polysilicon from being silicided, a mask may be used that allows the active area to use the gate oxide and nitride discussed above and the edge region to have a polysilicon/oxide/nitride stack. The edge region oxide would be preserved past the silicidation step.

Further aspects of the present invention which will find application in a variety of semiconductor devices provide alternatives for making connections to high current contact areas. The metalization discussed above in the active area and edge region is relatively thin, about the thickness of the gate to prevent shorting. Wire bonding to this thickness can only be done with care. Further, the gate interconnect stripes which connect gate fingers (e.g., the bonding areas shown in FIG. 7) may have reduced breakdown voltage even if they are "field plated". In one alternative further device masks for further metalization may be avoided if the lower surface of a lid for covering the device is metalized only in areas corresponding to the bonding areas (see FIG. 7) on the device upper surface. (Lids for such devices are discussed in U.S. Pat. No. 5,446,316 issued Aug. 29, 1995 to Temple, et al. and U.S. Pat. No. 5,521,436 issued May 28, 1996 to Temple, which are incorporated by reference.) The metalization on the device should be nickel (or equivalent metal) so that solder applied to the device does not move out of the bonding areas.

It is more likely that the device will be prepared for packaging by applying a passivation overcoat to the surface of the device and that a top metalization layer (preferably gold) will be electrolessly applied a few microns thick. An etch allows the gate electrode to contact gate stripes (e.g., with an edge runner) while the main electrode makes contact to the source/emitter areas in a uniform pattern of contact areas which match up with areas where the shallow trench is enlarged to allow conservatively aligned and sized contact areas between the top metal and the silicide primary metal. Because the silicide is quite conductive (on the order of a few tenths of an ohm/square to several ohms/square) the inter-contact spacing can be large. This means that the extra space taken for the contact windows will not greatly decrease Off-FET channel density. Note also that the silicided polysilicon regions over the On-FETs are convenient locations for top metal contact to the gate stripes.

Figure 14:
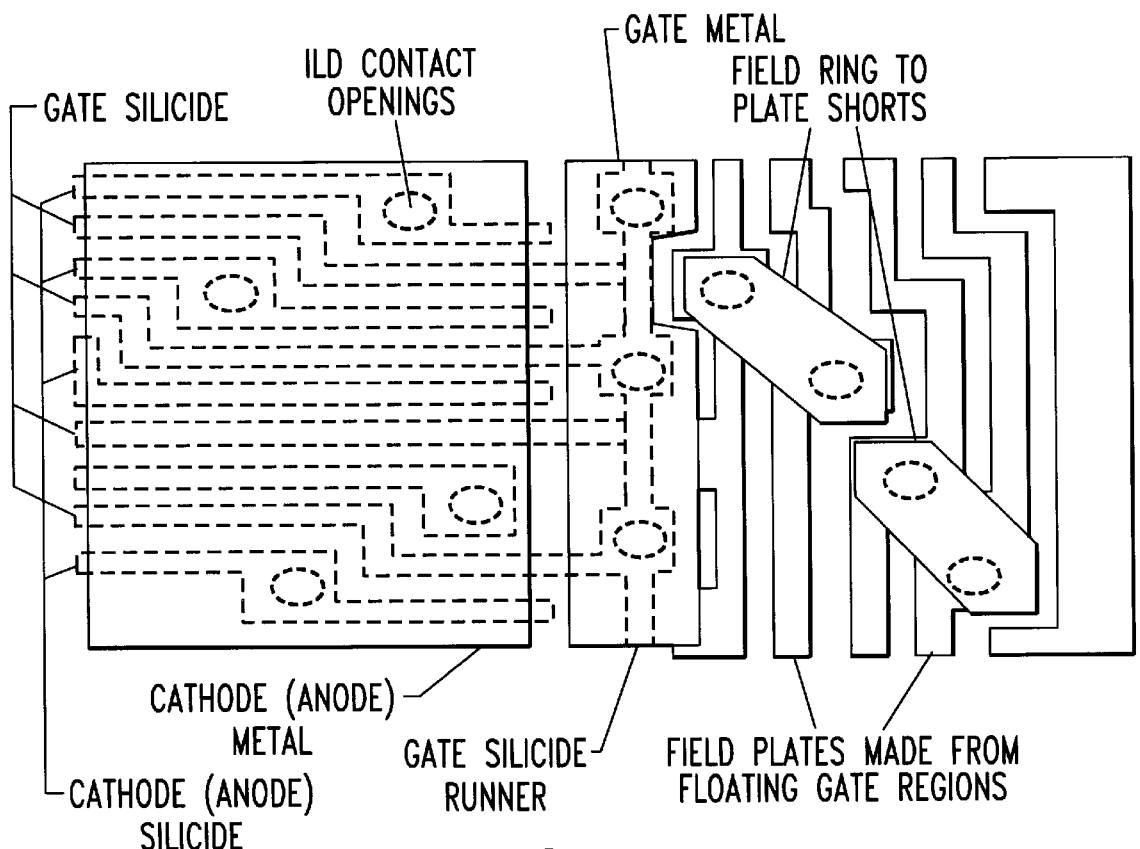
FIG. 14 is an overhead view of the edge region in the embodiment of FIG. 13.

If high current metal electrodes are to be provided additional masks may be used to form the electrode contacts. After the self-aligned silicide is formed, a conformal insulator layer such as BPSG may be applied, taking care not to minimize oxidation of the silicide in any subsequent heat treatment. A mask may then be used for an etch through the insulator layer to the widened regions of the source/emitter stripes for an anode contact. Similarly, in the device periphery and within the breakdown voltage termination region the contact windows may be formed over the widened regions of the gate stripes. Since the gate current is relatively small a dense pattern of contacts is not required. Thereafter an electrode metal may be deposited at normal thicknesses for power devices and patterned to form the anode and gate contacts, and any other interconnect metal links that may be needed, for example to tie the field rings to the field plates as illustrated in FIG. 14.

Figure 10:
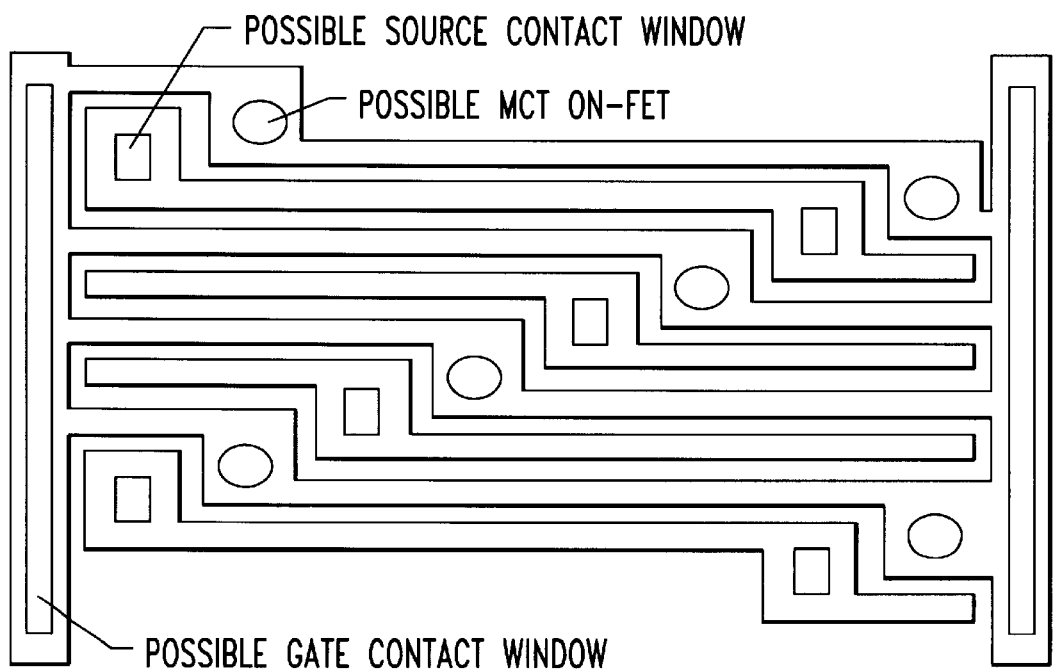
FIG. 10 is an overhead view of "snake-like" gate and source metalization in yet a further embodiment of the present invention.

Excess contact area can be minimized by using a "snake-like" surface pattern for the gate and source runners, such as illustrated in FIG. 10. With this layout the source contact density may be easily adjusted by increasing or decreasing the length of the narrower non-contacted stripes between contacted regions. Conductivity of the runners may be increased (and the number of runners reduced) by forming the runners using self-aligned silicide. This would also ease alignment tolerances in the contact areas. Conductivity may be further increased by using the emitter enhancement implant discussed above.

The method of the present invention may be used to fabricate a variety of semiconductor devices. For example, one device which benefits from the method is the Fast Turn-Off semiconductor device (FTO) which has an On-FET and an Off-FET on a first surface of the semiconductor substrate and a least an Off-FET on the second, opposite surface of the substrate. The Off-FET on the second surface is for shorting the emitter junction on the first surface. An On-FET may also be provided on the second surface; that is, the FTO may have one or two means for turn-on, although it needs turn-off features on both surfaces. The FTO reduces switching times and losses and has a good forward drop. It can be operated as a pure FET whenever this is desirable, such as at device turn-off or turn-on. The process of the present invention described above may be used to form devices with On-and Off-FETs, such as an MCT, IGBT and the like, on the first side, and to form a device with an Off-FET, such as a simple FET and the like (or with both On- and Off-FETs), on the second side.

Figure 11:
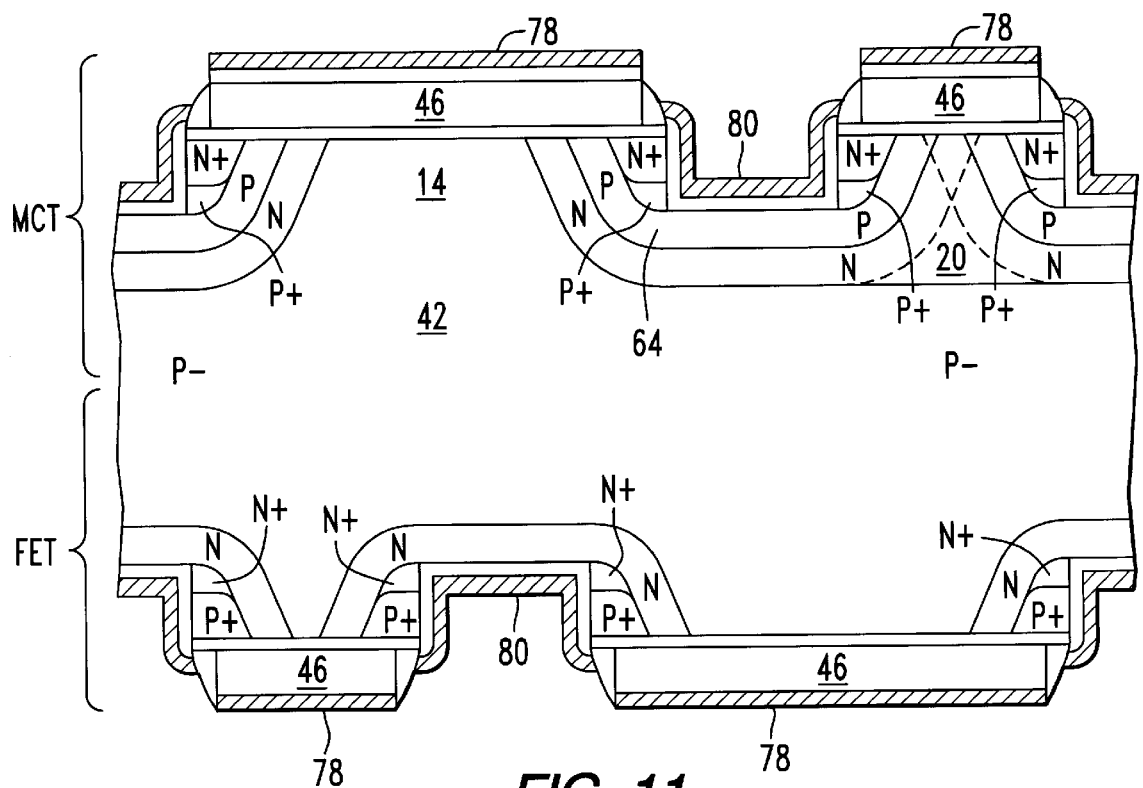
FIG. 11 is a vertical cross section illustrating a Fast Turn Off (FTO) combination MCT and FET in a further embodiment of the present invention.
Figure 12:
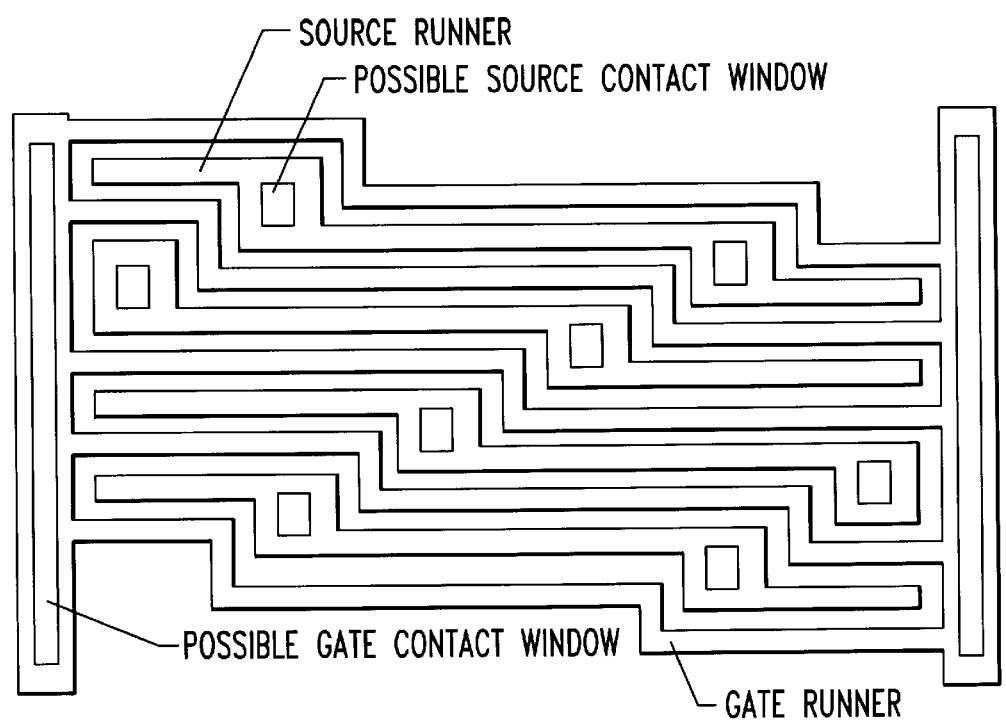
FIG. 12 is an overhead view of "snake-like" gate and source metalization for the FET surface of the embodiment of FIG. 11.

An embodiment of an FTO fabricated by the method described below is shown in FIG. 11 in which the first surface includes an MCT and the second surface includes a FET. Metalization of the first (top) surface may be as described in relation to FIG. 10, and metalization of the second (bottom) surface is shown in FIG. 12.

The steps to form the device of FIG. 11 may include:
a. grow gate the gate stack (polysilicon-thin oxide-nitride) on both sides of the substrate,
b. with a first mask pattern MCT-side (upper side in FIG. 11) for upper base 20 implant and then drive,
c. implant MCT well 64 and source 60,
d. apply LTO to MCT-side for sidewall spacers,
e. apply a protective layer to MCT-side to prepare for processing of FET-side, a thin layer of nitride followed by a thicker layer of polysilicon is suggested to match silicon expansion and for ease of removal with a wet etch,
f. if necessary, etch away FET-side bare silicon to prepare for processing, protecting MCT-side with resist,
g. with second mask pattern FET-side,
h. implant FET well and source,
i. drive wells and sources (Note that depending on the source and well impurity types, the wells and sources will generally be separately implanted and each partially driven so that, at the end of this step the top and bottom side FET structures are functional. These drives must anticipate the later processing thermal steps associated, for example, with the interlayer dielectrics such as BPSG.)
j. form FET-side sidewall spacers,
k. etch FET-side shallow trenches,
l. apply protective layer to FET-side to prepare for further processing of MCT-side (see step e),
m. remove MCT-side protective layer,
n. form MCT-side sidewall spacers,
o. etch MCT-side shallow trenches,
p. form MCT-side self-aligned silicide layer, where the final higher temperature Rapid Thermal Annealing typical of silicide formation need not be performed now,
q. with a third mask apply a passivation overcoat (not shown) to MCT-side with openings where metal regions will be plated later (the overcoat will also act as a scratch protection layer, and may be a nitride or a silicon/silicon dioxide (such as SIPOS) which can be selectively removed without attacking the silicide metalization),
r. protect the MCT-side with resist and remove scratch protection layers from FET-side,
s. etch the FET-side gate stack to expose gate polysilicon,
t. form self-aligned silicide layer on FET-side, with the final high temperature step,
u. with fourth mask apply a passivation overcoat (not shown) to FET-side with openings where metal regions will be plated later, and
v. electroless plate both sides for subsequent packaging.

Variations to these steps may also be used. For example, the well and source steps may be reversed and separate drives used to afford greater flexibility.

Figure 13:
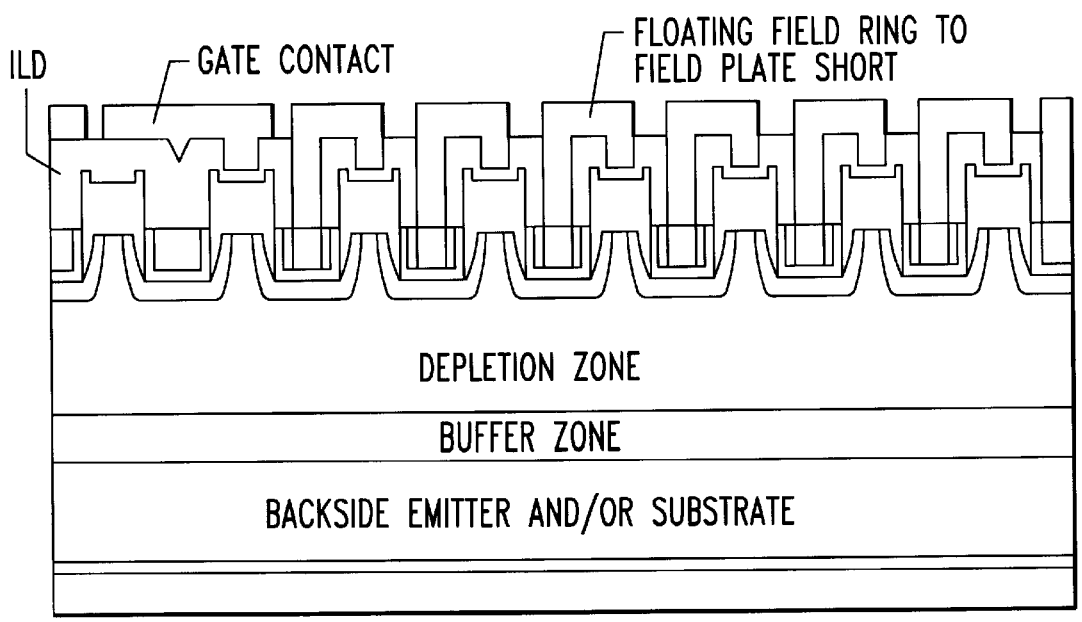
FIG. 13 is a vertical cross section illustrating an edge region interlevel dielectric layer in a further aspect of the present invention.

A further aspect of the present invention related to the floating field rings improves the adaptability of the method to existing packaging techniques. Two additional mask steps are used, although alignment is not critical. With reference to FIGS. 13 and 14, a removable interlevel dielectric layer (ILD) may be provided over the self-aligned silicide layer in the edge regions of the device and patterned prior to contact metalization (FIGS. 13–14 depict an IGBT as this aspect of the invention is applicable to a variety of semiconductor devices, not just MCTs.) Contact metalization (the same metalization patterned for the device active area) may also be patterned in the edge region to provide plate shorts which short the floating field plates to the adjacent inner floating field ring, thereby forming an edge termination composed of multiple field plated floating field rings. This aspect of the invention is based on the punch-through voltage VPT between adjacent rings being lower than the breakdown voltage of the gate oxide $V_{G-BV}$, with $V_{PT} < V_{G-BV}/2$ being preferred.

Two aspects of this feature reduce the edge space consumed by the rings and plates. The actual periphery of stress is not large compared to the amount of gate area represented in the active part of the device, and if a particular field plate-to-next outer ring oxide breaks down, the voltage contribution of that ring only is eliminated which does not substantially reduce the breakdown voltage of the entire termination region. To this end, a properly designed termination region would include extra rings, with the spaces between inner rings being smaller than otherwise appropriate. Ring spacing may thereafter increase gradually. FIG. 14 shows a radial section in which contact metal ties between ring and plate are located away from the gate bonding pads. Openings where contact metal meets silicide are generally larger to accommodate reasonable alignment tolerance. These openings are generally circular to have optimum curvature to thereby minimize an increase in peak silicon electric fields.

As will be appreciated by those of skill in the art, the present invention can reduce process time significantly; the applicant has found it can be reduced by a factor of two or more. Further, yield can be increased by the elimination of alignment steps in the cell active area, and by the reduced process time.

Perhaps even more significantly the degree of self-alignment afforded by the present invention allows a much smaller cell size, thereby improving the turn-off performance of cellular gated semiconductor power device, such as the MCT. For example, a three micron stripe repeat distance is likely achievable, where the gate is about two microns wide, the opening about one micron wide, the sidewall spacers about 2000 Å, and the silicided shallow trench about 0.6 microns.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A method of fabricating a thyristor semiconductor device whose operation is controlled with On-FETs and Off-FETs, the method comprising the steps of:
   (a) forming a dopant-opaque mask on a first surface of a semiconductor substrate having a first conductivity type layer at a second surface opposite the first surface and a second conductivity type layer thereon extending to the first surface, the mask having openings for forming cells for the thyristor semiconductor device;
   (b) diffusing a first conductivity type dopant through the openings, a multiplicity of the openings being spaced apart so that the diffusing first conductivity type dopant merges in adjacent ones thereof to form upper bases of three-layer bipolar junction transistors in the device in which the second conductivity type layer is a collector thereof, and plural of the openings being spaced apart so that the diffusing first conductivity type dopant does not merge in adjacent ones thereof to form second conductivity type drains of On-FETs, and wherein the first conductivity type layer is an emitter of further three-layer bipolar junction transistors in the device in which the upper bases are collectors; and (c) implanting a second conductivity type dopant and a first conductivity type dopant through the openings and diffusing the implanted dopants to form second conductivity type wells which function as both source regions of the On-FETs and emitters of the three-layer transistors, and to form first conductivity type regions in the second conductivity type wells which are sources of Off-FETs in which the upper bases are the drains thereof.

2. The method of claim 1 further comprising the steps of:

coating the openings and the dopant-opaque mask with a conformal oxide;

etching the conformal oxide to form spacers on sidewalls of the openings;

etching the first conductivity type sources of the Off-FETs to form a shallow trench between the spacers, to thereby expose an upper surface of the second conductivity type wells, and to expose vertical faces of the etched first conductivity type sources of the Off-FETs; and depositing a conductive metal film on the exposed upper surface of the second conductivity type wells and the exposed vertical faces of the first conductivity type sources.

3. The method of claim 2 further comprising the step of forming a conduction enhancing material on the exposed upper surface of the second conductivity type wells and the exposed vertical faces of the first conductivity type sources before depositing the conductive metal film thereon.

4. The method of claim 1 wherein the implanting step comprises the steps of:

implanting a first conductivity type dopant at a first energy level to thereby form a source layer beneath the openings;

implanting a second conductivity type dopant at a second energy level higher than the first energy level to thereby form a well layer beneath the openings deeper than the source layer, the second conductivity type dopant having a faster diffusion rate than the first conductivity type dopant; and diffusing the implanted first and second conductivity type dopants to thereby form (i) the second conductivity type wells which extend into the second conductivity type layer and beneath the mask, (ii) the first conductivity type regions which extend less far into the second conductivity type layer and beneath the mask than the second conductivity type wells, and (iii) a plus layer beneath the first conductivity type regions which plus layer has a higher concentration of second conductivity type dopant than a lower layer of the wells which extends beneath the plus layer and the mask.

5. The method of claim 1 further comprising the step of stacking a nitride on the mask before implanting the first and second conductivity type dopants.

6. The method of claim 1 further comprising the step of stacking a silicide on the mask before implanting the first and second conductivity type dopants.

7. The method of claim 1 further comprising the steps of providing a second mask for a top metal layer for providing an external electrical contact for the device, the second mask having second openings for contacting gate contacts and third openings for contacting source contacts.

8. The method of claim 7 further comprising the step of interleaving connectors for connecting the gate contacts with connectors for connecting the source contacts.

9. The method of claim 1 wherein, at the first surface, the cells are one of stripes, polygons, circles and squares.

10. The method of claim 1 wherein, at the first surface, the second conductivity type drains of the On-FETs are formed into one of polygons, circles and squares.

11. The method of claim 1 wherein the first conductivity type has an N type conductivity and the second conductivity type has a P type conductivity.

12. The method of claim 1 wherein the first conductivity type has a P type conductivity and the second conductivity type has an N type conductivity.

13. The method of claim 1 further comprising the step of forming at least one floating field ring around a periphery of the device using the dopant-opaque mask.

14. The method of claim 13 wherein the step of forming the floating field ring comprises the steps of providing the mask with a further opening for the floating field ring, the further opening being spaced from the openings for forming cells so that the diffusing first conductivity type dopant of the further opening does not merge with diffusing first conductivity type dopant of the cells.

15. A method of fabricating a multi-cell power semiconductor device which is operated with On-FETs and Off-FETs within the device comprising the steps of:

(a) forming a dopant-opaque mask on a surface of a second conductivity type layer, the mask having (i) a multiplicity of first openings spaced apart less than twice a first conductivity type dopant lateral diffusion distance for forming cells in the device, and (ii) plural second openings spaced apart more than twice the first conductivity type dopant lateral diffusion distance for forming On-FET drains in the device;

(b) diffusing a first conductivity type dopant through the openings so that the diffusing first conductivity type dopant merges in adjacent first openings to form upper bases of three-layer bipolar junction transistors in the device, and so that the diffusing first conductivity type dopant does not merge in adjacent second openings to form second conductivity type drains of On-FETs in the device;

(c) implanting a first conductivity type dopant at a first energy level for forming a source layer beneath the openings;

(d) implanting a second conductivity type dopant at a second energy level higher than the first energy level for forming a well layer beneath the openings deeper than the source layer, the second conductivity type dopant having a faster diffusion rate than the first conductivity type dopant;

(e) diffusing the implanted first and second conductivity type dopants to form (i) second conductivity type wells which extend into the upper bases and beneath the mask and which function as both source regions of the On-FETs and emitters of the three-layer transistors and (ii) first conductivity type regions which extends less far into the second conductivity type layer and beneath the mask than the second conductivity type wells and which are sources of Off-FETs in which the upper bases are the drains thereof, the second conductivity type wells having a plus layer beneath the first conductivity type regions which has a higher concentration of second conductivity type dopant than a lower layer of the second conductivity type wells which extends beneath the plus layer and the mask;

(f) coating the openings and the dopant-opaque mask with a conformal oxide;

(g) etching the conformal oxide to form spacers on sidewalls of the openings;

(h) etching the first conductivity type sources of the Off-FETs to form a shallow trench between the spacers, to thereby expose an upper surface of the second conductivity type wells, and to thereby expose vertical faces of the etched first conductivity type sources of the Off-FETs and of the plus layer;

(i) providing a conduction enhancing material atop the mask, on the upper surface of the second conductivity type wells, and on the vertical faces of the first conductivity type sources and the plus layer; and (j) providing a conductive metal film on the conduction enhancing material, thereby forming a gate conductor atop the mask and a source contact in the shallow trench.

16. The method of claim 15 wherein the mask has a third opening around a periphery of the device spaced apart from the first and second openings more than twice the first conductivity type dopant lateral diffusion distance for forming a floating field ring.

17. The method of claim 15 further comprising the steps of providing a second mask for a top metal layer for providing an external electrical contact for the device, the second mask having fourth openings for contacting contacts for the gate conductor and fifth openings for contacting the source contacts.

18. The method of claim 17 further comprising the step of interleaving connectors for connecting the gate contacts with connectors for connecting the source contacts.

19. The method of claim 15 wherein, at the first surface, the cells are stripes.

20. The method of claim 19 wherein, at the first surface, the second conductivity type drains of the On-FETs are formed into one of polygons, circles and squares.

21. The method of claim 15 further comprising the step, after the step of etching the first conductivity type sources of the Off-FETs to form a shallow trench, of implanting a second conductivity type dopant into the exposed upper surface of the second conductivity type wells for emitter enhancement.

22. The method of claim 21 wherein the step of implanting comprises two implants, a first of the two implants being deeper than a second of the two implants, the first implant for ohmic contact enhancement and the second implant for emitter efficiency improvement.

23. A method of fabricating a Fast Turn-Off semiconductor device comprising the steps of:

(a) providing a first conductivity type substrate having a first side and a second side;

(b) forming a first dopant-opaque mask on the first side of the substrate, the first mask having openings for forming a cellular semiconductor device with an On-FET and an Off-FET;

(c) diffusing a second conductivity type dopant through the openings on the first side, a multiplicity of the openings being spaced apart so that the diffusing second conductivity type dopant merges in adjacent ones thereof to form upper bases of three-layer bipolar junction transistors in the device in which the first conductivity type substrate is a collector thereof, and plural of the openings being spaced apart so that the diffusing second conductivity type dopant does not merge in adjacent ones thereof to form first conductivity type drains of the On-FETs; and (d) implanting a second conductivity type dopant and a first conductivity type dopant through the openings and diffusing the implanted dopants to form first conductivity type wells which function as both source regions of the On-FETs and emitters of the three-layer transistors, and to form second conductivity type sources in the first conductivity type wells which are sources of the Off-FETs in which the upper bases are the drains thereof;

(e) forming a second dopant-opaque mask on the second side of the substrate, the second mask having openings for forming a cellular semiconductor device with an Off-FET; and (f) implanting a second conductivity type dopant and a first conductivity type dopant through the openings in the second side and diffusing the implanted dopants to form second conductivity type wells and to form first conductivity type sources in the second conductivity type wells, the second conductivity type wells being an emitter of further three-layer bipolar junction transistors in the device in which the upper bases are collectors.

24. The method of claim 23, on the second side, further comprising the steps of:

coating the openings and the dopant-opaque mask with a conformal oxide;

etching the conformal oxide to form spacers on sidewalls of the openings;

etching the first conductivity type sources of the Off-FETs to thereby form a shallow trench between the spacers, to thereby expose an upper surface of the second conductivity type wells, and to thereby expose vertical faces of the etched first conductivity type sources of the Off-FETs; and depositing a conductive metal film on the exposed upper surface of the second conductivity type wells, and the exposed vertical faces of the first conductivity type sources.

25. The method of claim 23, on the first side, further comprising the steps of:

coating the openings and the dopant-opaque mask with a conformal oxide;

etching the conformal oxide to form spacers on sidewalls of the openings;

etching the second conductivity type sources of the Off-FETs to thereby form a shallow trench between the spacers to thereby expose an upper surface of the first conductivity type wells and to thereby expose vertical faces of the second conductivity type sources of the Off-FETs; and depositing a conductive metal film on the exposed upper surface of the first conductivity type wells and the exposed vertical faces of the second conductivity type sources.

* * * * *